(12) United States Patent
Goorjian et al.

(10) Patent No.: US 6,865,208 B1
(45) Date of Patent: Mar. 8, 2005

(54) ULTRAFAST LASER BEAM SWITCHING AND PULSE TRAIN GENERATION BY USING COUPLED VERTICAL-CAVITY, SURFACE-EMITTING LASERS (VCSELS)

(75) Inventors: Peter M. Goorjian, Oakland, CA (US); Cun-Zheng Ning, San Jose, CA (US)

(73) Assignee: The United States of America as represented by the Administrator of the National Aeronautics and Space Administration, Washington, DC (US)

( * ) Notice: Subject to any disclaimer, the term of this patent is extended or adjusted under 35 U.S.C. 154(b) by 0 days.

(21) Appl. No.: 10/171,554

(22) Filed: Jun. 10, 2002

(51) Int. Cl.[7] .............................. H01S 5/00; H01S 3/00

(52) U.S. Cl. ...................................... 372/50; 372/38.02
(58) Field of Search ................................ 372/50, 38.02

(56) References Cited

U.S. PATENT DOCUMENTS

| | | | | |
|---|---|---|---|---|
| 4,894,833 A | * | 1/1990 | Carlin ......................... | 372/44 |
| 5,204,870 A | * | 4/1993 | Faist et al. ................... | 372/45 |
| 5,243,619 A | * | 9/1993 | Albers et al. ................. | 372/97 |
| 5,475,416 A | * | 12/1995 | Kessler et al. .............. | 347/244 |
| 5,574,744 A | * | 11/1996 | Gaw et al. ................... | 372/50 |
| 5,576,879 A | * | 11/1996 | Nashimoto .................. | 359/248 |
| 5,727,014 A | * | 3/1998 | Wang et al. .................. | 372/96 |
| 5,781,671 A | * | 7/1998 | Li et al. ....................... | 385/17 |
| 6,016,326 A | * | 1/2000 | Claisse et al. ............... | 372/44 |
| 6,091,537 A | * | 7/2000 | Sun et al. .................... | 359/248 |
| 6,130,873 A | * | 10/2000 | Lazarev et al. ............. | 369/116 |
| 6,272,160 B1 | * | 8/2001 | Stronczer ................. | 372/38.02 |
| 6,285,704 B1 | * | 9/2001 | Kullander-Sjoberg et al. ............... | 372/96 |
| 6,399,936 B1 | * | 6/2002 | Hang et al. ................. | 250/216 |
| 6,567,454 B1 | * | 5/2003 | Fischer et al. ................ | 372/68 |

OTHER PUBLICATIONS

"Agilent Technologies' New Fiber Optic Transceivers Offer Industry's Lowest EMI Emissions–Gigabit Devices for Ethernet, iSCSI and Fibre Channel Also Provide Maximum Port Density and Flexibility," Business Wire, http://www.profound.com/htbin/get_pin, 2 pages, The Dialog Corporation (Jul. 10, 2001).

"Agilent Technologies Rolls Out Complete Physical Layer Gigabit Ethernet Solution Starting at $49 Per Port," Newsroom, http://www.agilent.com/about/newsroom/presrel/2000/14feb2000a.html, 2 pages (Feb. 14, 2000).

D. I. Babic, "The Interior Design of the New Laser," IEEE Spectrum, vol. 35, No. 2, 4 pages, The Institute of Electrical and Electronics Engineers, inc. (Feb. 1998).

D. I. Babic, "New Muxed Laser Arrays," IEEE Spectrum, vol. 35, No. 2, 2 pages, The Institute of Electrical and Electronics Engineers, Inc. (Feb. 1998).

S. W. Corzine, "Semiconductor Light–Source Essentials," IEEE Spectrum, vol. 35, No. 2, 5 pages, The Institute of Electrical and Electronics Engineers, Inc. (Feb. 1998).

L. Fan et al., "Dynamic Beam Switching of Vertical–Cavity Surface–Emitting Lasers with Integrated Optical Beam Routers," IEEE Photonics Technology Letters, vol. 9, No. 4, pp. 505–507, IEEE (Apr. 1997).

(List continued on next page.)

Primary Examiner—Minsun Oh Harvey
Assistant Examiner—Phillip Nguyen
(74) Attorney, Agent, or Firm—Robert M. Padilla; John F. Schipper

(57) ABSTRACT

Ultrafast directional beam switching is achieved using coupled VCSELs. This approach is demonstrated to achieve beam switching frequencies of 40 GHz and more and switching directions of about eight degrees. This switching scheme is likely to be useful for ultrafast optical networks at frequencies much higher than achievable with other approaches.

14 Claims, 3 Drawing Sheets

OTHER PUBLICATIONS

L. Fan et al., "Novel Verticaly–Cavity Surface–Emitting Lasers with Integrated Optical Beam Router," Electronic Letters, vol. 31, No. 9, pp. 729–730, IEEE (Apr. 27, 1995).

G. Fish, "Tunable Lasers Will Impact Optical Nets," EE Times, http://www.eetimes.com/story/OEG20010925S0070, 8 pages, CMP Media LLC (Sep. 25, 2001).

T. Fishman et al., "Cyclic Vertical Cavity Semiconductor Laser Arrays with Odd Numbers of Elements: Lasing Modes and Symmetry Breaking," Optics Letters, vol. 21, No. 8, pp. 600–602, Optical Society of America (Apr. 15, 1996).

K. S. Giboney et al., "The Ideal Light Source for Datanets," IEEE Spectrum, vol. 35, No. 2, 9 pages, The Institute of Electrical and Electronics Engineers, Inc. (Feb. 1998).

P. Goorjian et al., "Numerical Simulation of Ultrafast Directional Beam Switching in Coupled VCSELs," Integrated Photonics Research 2001, Monterey, California, Paper IWA4, Optical Society of America (Jun. 11–13, 2001).

P. Goorjian et al., "Simulations of Spatial Dynamics in Vertical–Cavity Surface–Emitting Laser Arrays," Nonlinear Optics: Materials, Fundamentals and Applications, Paper ThB22, pp. 380–382, Kauai–Lihue, Hawaii, Optical Society of America (Aug. 7–11, 2000).

P. Goorjian et al., "Transverse Mode Dynamics of VCSELs Through Space–Time Domain Simulation," Optics Express, vol. 5, No. 3, pp. 55–62, Optical Society of America (Aug. 2, 1999).

P. Goorjian et al., "Ultrafast Beam Self–Switching by Using Coupled VCSELs," Session Nonlinear Optics I, QEP–15/Photonics 2001 $15^{th}$ Institute of Physics Quantum Electronics and Photonics/Photonics 2001 Joint Conference, Paper 1, University of Strathclyde, Glasgow, Scotland (Sep. 3–6, 2001).

J. K. Guenter et al., "Commercialization of Honeywell's VCSEL Technology: Further Developments," Proceedings of the SPIE, vol. 4286, 14 pages, SPIE (2001).

J. Hecht, "VCSELs Turn to High–Speed Transmission Optical Networking: Vertical–Cavity Surface–Emitting Lasers," Laser Focus World–Optoelectronics and Laser Technology Advances, 4 pages, PennWell Corporation (Feb. 2001).

G. Held, "On the Road to OC–768," IT Pro, 1520–9202/01, pp. 46–48, IEEE (Mar./Apr. 2001).

J. P. Hohimer et al., "Near–Diffraction–Limited Angle–Switchable Output Beam from a Broad–Area Diode Laser with an Intracavity Spatial Phase Controller," Applied Physics Letter 58 (25), pp. 2886–2888, American Institute of Physics (Jun. 24, 1991).

"Honeywell VCSEL High Speed Characteristics," http://content.honeywell.com/vcsel/advantage/highspeed.stm, 2 pages, Honeywell Inc. (1998–2001).

H. A. Jones–Bey, "VCEL Makers Storm 1300–nm Telecom Castle," Laser Focus World, 3 pages, PennWell Corporation (Aug. 2001).

M. Lebby, "Optoelectronic Devices and Packaging: VCSEL Technology," $4^{th}$ IEEE Workshop on AST, Phoenix Applied Research Center, 10 pages, IEEE (Jan. 1998).

C. Matsumoto et al., "Optical Suppliers to Demo 100–Gbit Connections," EE Times, http://www.eetimes.com/story/OEG20010601S0053, 2 pages, CMP Media LLC, (Jun. 1, 2001).

"Modulating VCSELs," Honeywell Application Sheet, Micro Switch Sensing and Control, 006703–1–EN IL50 GLO 498, 19 pages, Honeywell, Inc.

"Multi–Vendor, Interoperability Demonstration Shows Serial 850 nm Optical Exceed Reach Requirements for Next Generation 10–Gigabit Ethernet Networks–850 nm 10–Gigabit Ethernet Technology to Enable cost Effective Links . . . ," Business Wire, http://www.profound.com/htbin/get_pin, 2 pages, The Dialog Corporation (Sep. 18, 2001).

D. D. Murray, "VCSEL Transceiver Market Triples Consumption," Laser Focus World–Optoelectronics and Laser Technology Advances, 2 pages, PennWell Corporation (Feb. 2001).

D. Natan et al., "Localization Immunity and Coherence of Extended Two–Dimensional Semiconductor Vertical Cavity–Locked Laser Arrays," Journal of Optical Society of America B, vol. 14, No. 6, pp. 1501–1504, Optical society of America (Jun. 1997).

C. Z. Ning et al., "Effective Bloch–Equations for Semiconductor Lasers and Amplifiers," IEEE Journal of Quantum Electronics, vol. 33, No. 9, pp. 1543–1550, IEEE (Sep. 1997).

C. Z. Ning et al., "Microscope Modeling and Simulation of Transverse–Mode Dynamics of Vertical–Cavity Surface–Emitting Lasers," Journal of Optical Society of America B, vol. 16, No. 11, pp. 2072–2082, Optical Society of America (Nov. 1999).

M. Orenstein et al., "Supermodes of Hermite Tapered Arrays of Vertical–Cavity Semiconductor Lasers," IEEE Journal of Quantum Electronics, vol. 35, No. 7, pp. 1062–1066, IEEE (Jul. 1999).

"Parallel Optical Interconnect Module Ships," EE Times, http://www.eetimes.com/story/OEG20010730S0015, 2 pages, CMP Media LLC (Jul. 30, 2001).

R. P. Schneider, Jr., "Epitaxial Growth of the Surface–Emitting Laser," IEEE Spectrum, vol. 35, No. 2, 2 pages, The Institute of Electrical and Electronics Engineers, Inc. (Feb. 1998).

R. P. Schneider, Jr., "A New Planar Laser," IEEE Spectrum, vol. 35, No. 2, 2 pages, The Institute of Electrical and Electronics Engineers, Inc. (Feb. 1998).

C. SimoneauX, "VCSELs Propel 10–Gbit Ethernet," EE Times, http://www.eetimes.com/story/OEG20010806S0059, 4 pages, CMP Media LLC (Aug. 6, 2001).

Y. Sun et al., "Thermally Controlled Lateral Beam Shift and Beam Steering in Semiconductor Lasers," IEEE Photonics Technology Letters, vol. 7, No. 1, pp. 26–28, IEEE (Jan. 1995).

"Superdata (10/40/160 G BPS/Channel) Deployment," http://www.electronicast.com/rrrparts/rrr_5.html, 1 page.

J. Tatum, "VCSELs in the Information Age," SPIE Optics in Information Systems Newsletter, 2 pages, SPIE (Apr. 2001).

Connie J. Chang–Hasnain, "Vertical–Cavity Surface Emitting Lasers", Semiconductor Lasers Past, Present, and Future, 1996, pp. 145, 156–159, AIP Press, Woodbury, New York.

* cited by examiner

ULTRAFAST LASER BEAM SWITCHING AND PULSE TRAIN GENERATION BY USING COUPLED VERTICAL-CAVITY, SURFACE-EMITTING LASERS (VCSELS)

ORIGIN OF THE INVENTION

The invention described herein was jointly made by an employee of the United States Government and by a non-Government employee, whose contribution was made in the performance of work under a NASA contract and is subject to the provision of Section 305 of the National Aeronautics and Space Act of 1958, Public Law 85–568 (72 Stat. 435; 42 U.S.C. 2457).

BACKGROUND OF THE INVENTION

1. Technical Field of the Invention

The present invention relates to information processing and transmission in optical communication systems, and more specifically, it relates to techniques for increasing the switching and modulation speed of vertical-cavity surface-emitting lasers (VCSELs).

2. Description of the Prior Art

The limit to switching and modulation speed of semiconductor lasers is a fundamental bottleneck for information processing and transmission in optical communication systems. This limit comes from the relatively slow carrier recombination lifetime in the III–V semiconductors used for optical applications. Though progress in pushing this limit in the past has been made, these improvements cannot meet the demand for higher speed in the long run. A new paradigm has to be explored to maintain the momentum of technology development.

The ability to steer or switch propagation direction of a laser beam in a controllable way is very important for many applications, and especially for optical interconnect networks. Beam scanning and steering in edge emitting lasers have been realized using thermal control (See Y. Sun, C. G. Fanning, S. A. Biellak, and A. E. Siegman, IEEE Photonics Technol. Lett. 7,26(1995)) and spatial phase controlling techniques (See J. P. Hohim, D. C. Craft, G. A. Vawter, and D. R. Myers, Appl. Phys. Lett. 58, 2886 (1991)). For optical interconnect applications, all the well-known advantageous attributes of vertical-cavity surface-emitting lasers (VCSELs) make them especially appealing elements. However, full advantage cannot be taken of compact two-dimensional (2D) VCSEL arrays if bulky external passive optical elements are used for routing and switching, For this reason, routers integrated together with VCSELs that can be controlled electronically are especially important to reduce the overall volume of an interconnect network. See L. Fan, M. C. Wu, and P. Gradzinski, Electron. Lett. 31, 729 (1995) and L. Fan, M. C. Wu, H. C. Lee, and P. Grodzinski, IEEE Photonics Technol. Left. 9, 505(1997).

Recently, it has been demonstrate that, by introducing a phase-shifter in part of the VCSEL cross-section, beam switching up to 2 gigahertz can be achieved. Another more conventional approach to VCSEL beam manipulation is to use coherently coupled VCSEL arrays. Indeed VCSEL arrays of various kinds have been quite extensively researched for tailoring and engineering near and far field patterns. See M. Orenstein and T. Fishman, "Supermodes of Hermite Tapered Arrays of Vertical-Cavity Semiconductor Lasers," IEEE J. Quantum Electron 35 1062–1066, (1999). See D. Natan, M. Margalit and M. Orenstein, "Loca;lization immunity And Coherence Of Extended Two-Dimensional Semiconductor Vertical Cavity-Locked Laser Arrays," J. Opt Soc. Am. B 14, 1501–1504, (1997). See T. Fishman and M. Orenstein, "Cyclic Vertical Cavity Semiconductor Laser Arrays With Odd Numbers Of Elements: Lasing Modes And Symmetry Breaking." Opt. Lett. 21 600–602, (1996)

It is therefore desirable to provide techniques for increasing the switching and modulation speed of semiconductor lasers for use in applications such as information processing and transmission in optical communication systems.

SUMMARY OF THE INVENTION

It is an object of the present invention to produce light output from two or more coupled VCSELs that are spatially dynamic at an extremely high frequency. The coupling is achieved by small inter-VCSEL separations and the VCSELs are all biased at the same steady current near threshold.

This and other objects will be apparent to those skilled in the art based on the disclosure herein.

A basic embodiment of the invention includes vertical-cavity surface-emitting lasers (VCSELs) spatially coupled together; and a current source connected to the VCSELs, with a steady current biased above threshold current, where the coupling of the VCSELs produces an output laser beam having a spatial oscillation. A switching device is shown that transfers the near laser field emitted by two coupled VCSELS to two receivers by using a micro lens system. Another embodiment is shown that produces a far field device where two VCSELs produce an output beam that is not directed through a micro lens system.

The invention is based on computer simulations of the light output of coupled VCSELs. The model equations that are solved on the computer are an approximation to the semi-conductor Maxwell-Blotch equations.

This disclosure illustrates that the resulting far field pattern has two lobes that are oscillating out of phase and are useful for beam switching. Dynamic beam switching of vertical-cavity surface-emitting lasers (VCSELs) has important applications for switching and routing in optical interconnect networks.

The time evolution of the spatial profiles of the laser and carrier density is obtained by solving the coupled partial differential Maxwell-Blotch equations that govern their evolution by a finite-difference algorithm. The algorithm is fairly general; it can handle devices with one or multiple active regions of any shapes, which can be either gain or index guided. The physical modeling includes the effects of nonlinear carrier dependence and dispersion with respect to wavelength on the optical gain and refractive index. The modeling of the optical susceptibility is based on first-principles and includes device details such as a quantum well structure and many-body effects.

DETAILED DESCRIPTION OF THE INVENTION

Figure 1A:
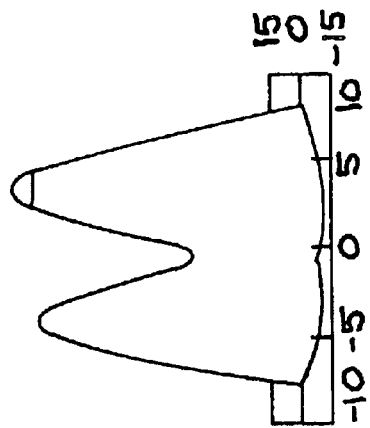
FIGS. 1A–1F show a perspective view of the far field beam intensity over one and one-half cycles of beam switching. The switching speed is forty-two gigahertz and the beams are separated by about eight degrees.
Figure 1B:
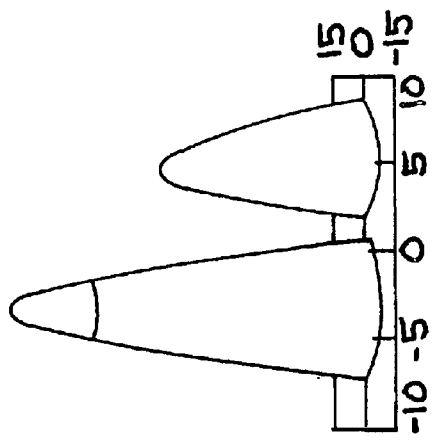
Figure 1C:
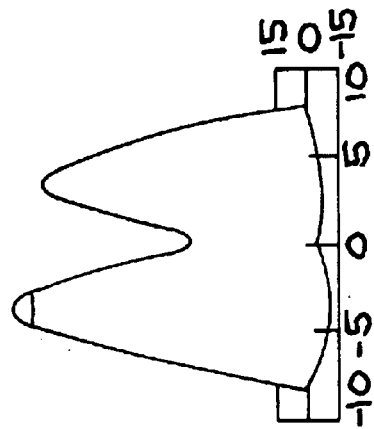
Figure 1D:
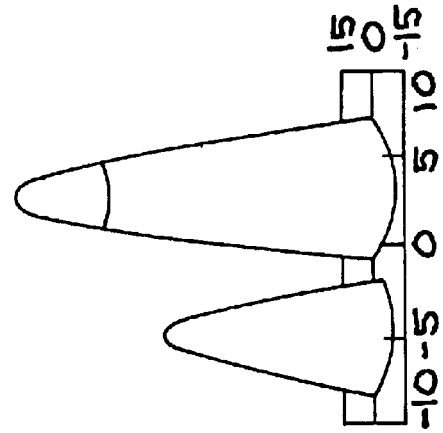
Figure 1E:
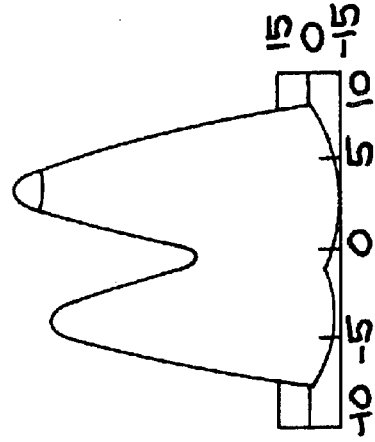
Figure 1F:
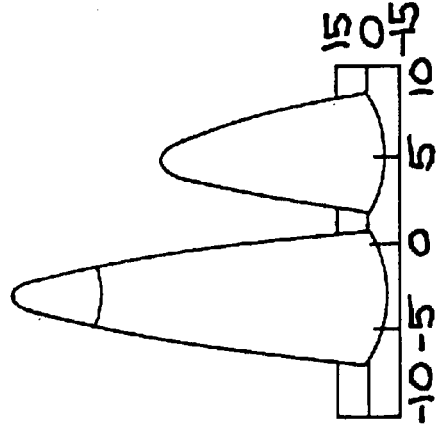
Figure 2A:
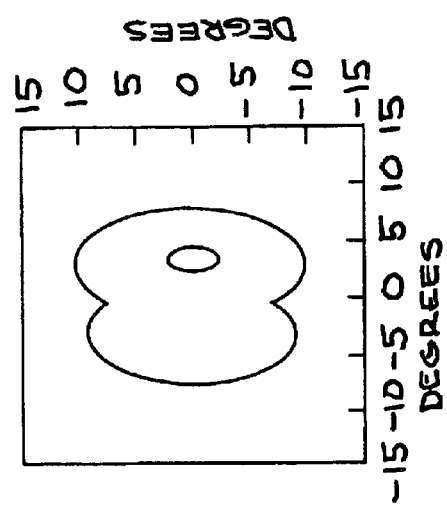
FIGS. 2A–2F show the top view of the far field beam intensity over one and one-half cycles of beam switching. As in FIGS. 1A–1F, the switching speed is forty-two gigahertz and the beams are separated by about eight degrees.
Figure 2B:
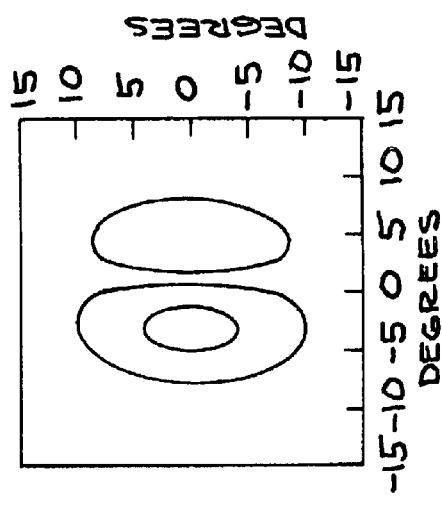
Figure 2C:
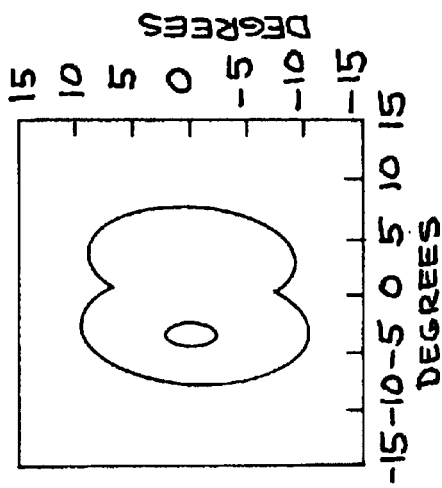
Figure 2D:
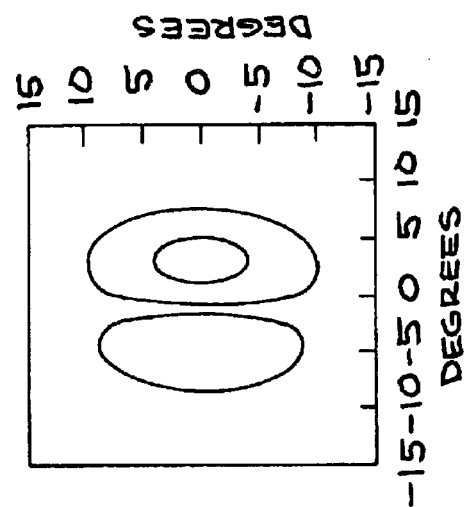
Figure 2E:
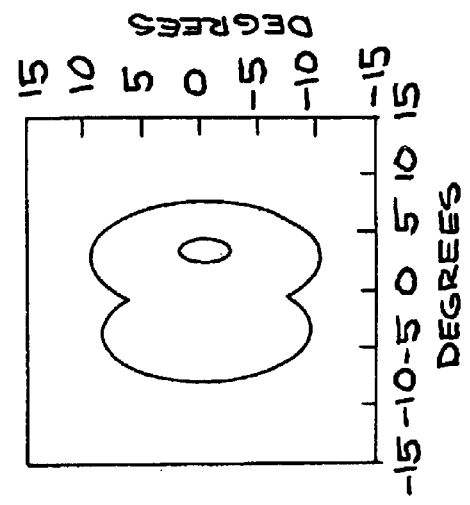
Figure 2F:
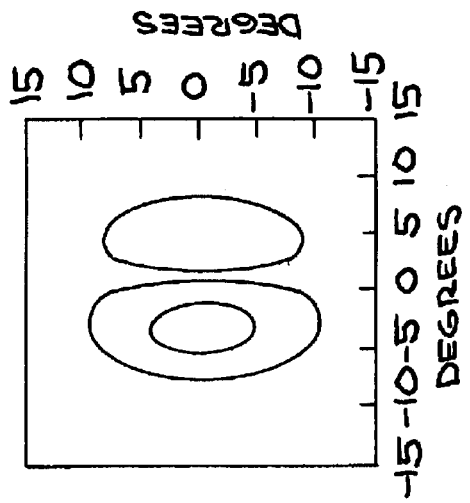

A new method of directional beam switching is proposed that uses two or more coupled vertical-cavity surface emitting lasers (VCSELs). When two or more VCSELs are coupled by a small inter-VCSEL separation, and biased at the same steady current near threshold, then the resulting light output is spatially dynamic at an extremely high frequency. The invention is based on computer simulations of the light output of coupled VCSELs. The model equations that are solved on the computer are an approximation to the semi-conductor Maxwell Blotch equations. The first simulations are for two coupled VCSELs operating at 980 nm with circular current apertures of 5.6 $\mu$m in diameter and the resulting switching frequency is at forty-two gigahertz. The far field beams are separated by about eight degrees. The near field pattern also showed two spots that were oscillating in relative intensity. However, they were oscillating ninety degrees out of phase with respect to the oscillation in the far field pattern. Simulations that use two square VCSELs have been performed that increase the frequency to fifty gigahertz and the far field pattern remains similar. For three round VCSELs in a ring patter, the far field beam moved in a circular pattern at a frequency of thirty-one gigahertz. For four round VCSELs in a square pattern, two far field circularly shaped beams moved left and right at a frequency of fifty gigahertz.

As shown in FIGS. 1A–1F and FIGS. 2A–2F, the resulting far field pattern has two lobes that are oscillating out of phase and are useful for beam switching. See Peter Goorjian and Cun-Zheng Ning: "Numerical Simulation of Ultrafast Directional Beam Switching in Coupled VCSELs," Paper IWA4, IPR 2001, Integrated Photonics Research 2001, Optical Society of America, Monterey, Calif., Jun. 11–13, 2001, incorporated herein by reference and Peter Goorjian and CunZheng Ning: "Ultrafast Beam Self-Switching by Using Coupled VCSELs," Paper 1 in Session Nonlinear Optics I, QEP-15/Photonics 2001 15th Institute of Physics Quantum Electronics and Photonics/QEP-15 2001 joint conference, University of Strathclyde, Glasgow, Scotland, Sep. 3–6, 2001.

For a discussion of the semiconductor Maxwell-Blotch equations upon which the present invention were modeled, see C. Z. Ning, R. A. Indik and J. V. Moloney, "Effective Blotch-Equations For Semiconductor Lasers And Amplifiers," IEEE J. Quantum Electron. 33, 1543–1550, (1997). The time evolution of the spatial profiles of the laser and carrier density is obtained by solving the coupled partial differential equations by a finite-difference algorithm that governs the evolution of the spatial profiles. The algorithm is fairly general; it can handle devices with one or multiple active regions of any shapes, which can be either gain or index guided. See P. M. Goorjian, C. Z. Ning, and G. P. Agrawal, "Simulations of Spatial Dynamics in Vertical-Cavity Surface-Emitting Laser Arrays," Paper ThB22, Nonlinear Optics: Materials, Fundamentals and Applications, OSA, Kauai-Lihue, Hi., Aug. 7–11, 2000. There is no a priori assumption about the type or number of modes. The physical modeling includes the effects of nonlinear carrier dependence and dispersion with respect to wavelength on the optical gain and refractive index. The modeling of the optical susceptibility is based on first-principles and includes device details such as a quantum well structure and many-body effects. See P. M. Goorjian and C. Z. Ning, "Transverse mode dynamics of VCSELs through space-time simulation," Opt. Express 5, 55–62, (1999). See C. Z. Ning and P. M. Goorjian, "Microscope Modeling And Simulation Of Transverse Mode Dynamics Of Vertical-Cavity Surface-Emitting Lasers," J. Opt. Soc. Am. B 16, 2072–2082, (1999). Temporal dynamics as fast as on a picosecond scale can be resolved. This bottom-up approach uses measured material parameters and quantum well structure parameters, with the number of free parameters minimized. The VCSELs given herein are based on InGaAs/GaAs quantum well structures.

Further calculations were made to show the effects of varying the inter VCSEL separation, the injection current and the VCSEL size on the frequency, relative brightness and angular separation of the two beams. Also similar studies were made of VCSELs arrayed in a ring pattern.

Figure 3:
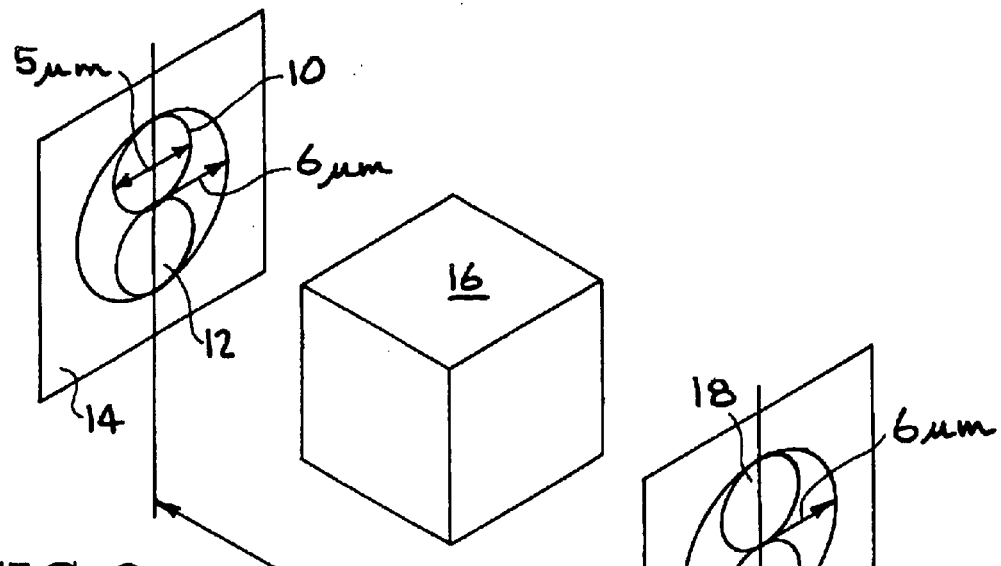
FIG. 3 shows a device for coupling the near field laser output of two coupled VCSELs to two receivers by using a micro lens system.
Figure 4:
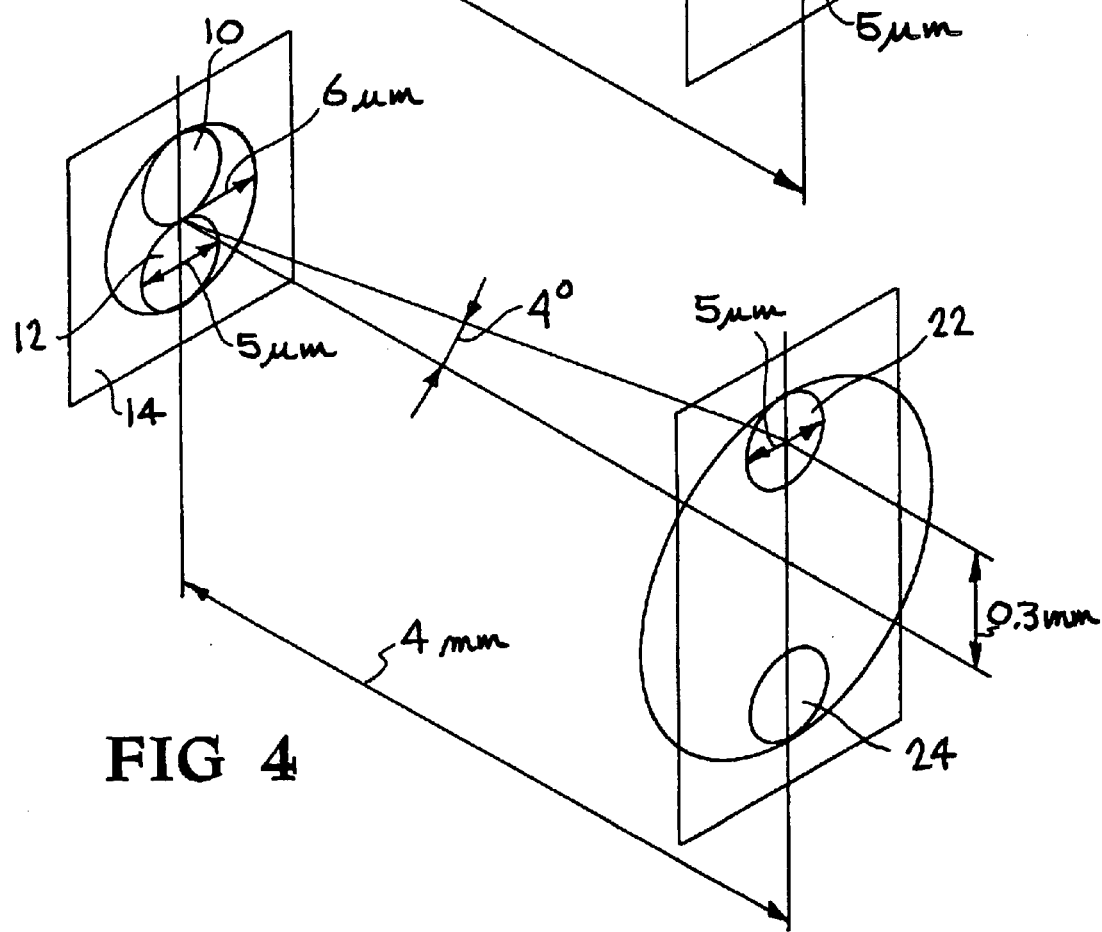
FIG. 4 shows a device for coupling the far field laser output of two coupled VCSELs to two receivers.

FIG. 3 shows a proposed switching device that would transfer the near laser field emitted by two coupled VCSELS to two receivers by using a micro lens system. In the figure, VCSELs 10 and 12 each have an output aperture diameter of 5 $\mu$m located at plane 14. The output aperture of each VCSEL is located within a circular diameter of 12 $\mu$m. With an appropriate micro lens system 16, as would be understood by those skilled in the art, the near field beam is directed to two receivers 18 and 20 located 25 $\mu$m from the output apertures of VCSELs 10 and 12. FIG. 4 illustrates a far field device where the same two VCSELs 10 and 12 produce an output beam that is not directed through a micro lens system. It is shown that the far field beam oscillates between plus and minus 4 degrees, so that at 4 mm from the VCSELs, the beam is oscillating between 2 receivers, (each 5 microns in diameter), that are separated by 0.6 mm. Receivers 22 and 24, spaced apart by 0.6 mm, are located 4 mm from the output apertures of VCSELs 10 and 12.

The foregoing description of the invention has been presented for purposes of illustration and description and is not intended to be exhaustive or to limit the invention to the precise form disclosed. Many modifications and variations are possible in light of the above teaching. The embodiments were chosen and described to best explain the principles of the invention and its practical application. The scope of the invention is to be defined by the following claims.

We claim:

1. A method for switching the output of two or more vertical cavity surface emitting lasers (VCSELs) from one beam direction to another beam direction, the method comprising:

providing an array of two or more vertical cavity surface emitting lasers (VCSELs), spaced apart by a selected separation gap so that the VCSELs are coherently coupled together spatially; and providing a common current source connected to all of the VCSELs to provide a simultaneous steady current biased above a selected threshold current, wherein the coherent coupling of the VCSELs produces a combined single output laser beam that, in a near field beam pattern oscillates between a first beam position and at least one beam position that differs from the first beam position, and in the far field beam pattern oscillates between a first beam direction and at least one beam direction that differs from the first beam direction.

2. The method of claim 1, further comprising providing said array of VCSEL elements as two circularly shaped VCSELs with diameters of about 5.6 microns and with said separation gap of about 0.8 microns, with each VCSEL operating at a wavelength of about 980 nanometers, whereby said array of VCSEL elements produces a laser beam that oscillates at about 42 GHz and with a far field beam direction that oscillates at about 8 degrees.

3. The method of claim 1, further comprising providing said array of VCSEL elements as two substantially square VCSELs with side lengths of about 5.6 microns and with said separation gap of about 0.8 microns, with each VCSEL operating at a wavelength of about 980 nanometers, whereby said array of VCSEL elements produces a laser beam that oscillates at about 50 GHz and with a far field beam direction that oscillates at about 8 degrees.

4. The method of claim 1, further comprising providing said array of VCSEL elements as four circularly shaped VCSELs with side lengths of about 5.6 microns and with said separation gap of about 0.8 microns between two nearest neighbor VCSELs, with each VCSEL operating at a wavelength of about 980 nanometers, whereby said array of VCSEL elements produces a laser beam that oscillates at about 50 GHz and with a far field beam direction that oscillates with a diameter of about 8 degrees.

5. The method of claim 1, further comprising providing said array of VCSEL elements as three circularly shaped VCSELs with diameter of about 5.6 microns and positioned in a circular pattern, with said separation gap of about 0.8 microns, with each VCSEL operating at a wavelength of about 980 nanometers, whereby said array of VCSEL elements produces a laser beam that rotates in a circle with a rotation rate of about $2\pi \times 32 \times 10^9$ rad/sec.

6. A method for switching the output of two or more vertical cavity surface emitting lasers (VCSELs) from one beam direction to another beam direction, the method comprising:

providing two or more vertical cavity surface emitting lasers (VCSELs), spaced apart by a selected separation gap that is no greater than one fourth of a diameter of a VCSEL so that the VCSELs are coherently coupled together and providing a common current source connected to all of the VCSELs to provide a steady current biased above a selected threshold current to all of the VCSELs simultaneously;

wherein the coherent coupling of the VCSELs produces a near field beam pattern of first and second spaced apart near field beam spots with respective first and second near field beam spot intensities that oscillate relative to each other with a frequency that is at least 32 GHz.

7. The method of claim 6, further comprising providing each of said VCSELs with a diameter of about 5.6 microns and choosing said separation gap, measured between adjacent VCSELs, to lie within a range from about 0.4 microns to about 1.2 microns.

8. The method of claim 6, further comprising operatively positioning a micro lens system to direct a near optical field of said laser output beam onto a target that is drawn from a group of targets consisting of at least one optical fiber, at least one photodetector element and at least one optical component.

9. The method of claim 6, further comprising positioning said VCSELs to direct a far optical field of said laser output beam onto a target that is drawn from a group of targets consisting of at least one optical fiber, at least one photodetector element and at least one optical component.

10. The method of claim 6, further comprising providing each of said at least two VCSELs with a substantially circular cross section.

11. The apparatus of claim 10, further comporising selecting said diameter of each of said VCSELs to be substantially 5.6 microns.

12. The apparatus of claim 6, further comprising providing each of said at least two VCSELs with a substantially square cross section.

13. The method of claim 6, further comprising causing said output laser beam to oscillate between a first beam position and at least one beam position that differs from the first beam position with at least one of the frequencies 32 GHz, 41 GHz and 50 GHz.

14. The method of claim 6, further comprising selecting said separation gap to be a small fraction of a diameter of said active region of at least one of said VCSEL array elements.

* * * * *